United States Patent [19]

Kobayashi et al.

[11] 4,323,418
[45] Apr. 6, 1982

[54] METHOD FOR GROWING A PIPE-SHAPED SINGLE CRYSTAL

[75] Inventors: Toshio Kobayashi, Hinodemachi; Tetsu Oi, Tokyo, both of Japan

[73] Assignee: Hitachi, Ltd., Tokyo, Japan

[21] Appl. No.: 92,671

[22] Filed: Nov. 9, 1979

[30] Foreign Application Priority Data

Nov. 10, 1978 [JP] Japan .................. 53/137875

[51] Int. Cl.³ .............................................. C30B 15/24
[52] U.S. Cl. .............................. 156/617 SP; 156/608; 156/DIG. 88
[58] Field of Search ......... 156/DIG. 88, 608, 617 SP, 156/DIG. 74; 422/246, 249; 252/62.5 G; 75/123 N; 423/594

[56] References Cited

U.S. PATENT DOCUMENTS

| | | | |
|---|---|---|---|
| 3,096,158 | 7/1963 | Gaule et al. | 422/246 |
| 3,115,469 | 12/1963 | Hamilton | 156/DIG. 74 |
| 3,238,024 | 1/1966 | Cremer et al. | 156/608 |
| 3,663,180 | 5/1972 | Brissot | 156/608 |
| 3,687,633 | 8/1972 | LaBelle, Jr. et al. | 156/608 |
| 3,801,309 | 4/1974 | Mlavsky | 156/608 |
| 3,846,082 | 11/1974 | LaBelle, Jr. et al. | 156/608 |
| 3,853,489 | 12/1974 | Bailey | 156/608 |

FOREIGN PATENT DOCUMENTS

| | | | |
|---|---|---|---|
| 2452215 | 5/1975 | Fed. Rep. of Germany | 156/608 |
| 48-6035 | 2/1973 | Japan | 156/608 |
| 1059916 | 2/1967 | United Kingdom | 156/608 |

*Primary Examiner*—Gregory N. Clements
*Attorney, Agent, or Firm*—Birch, Stewart, Kolasch & Birch

[57] ABSTRACT

A susceptor made of a conductive material which has a melting point higher than that of a starting material and which does not react with the melt of the starting material is heated to a temperature not lower than the melting point of the starting material by the radio frequency induction heating. The starting material is fed onto the upper surface of the heated susceptor at a predetermined rate so as to melt the starting material, the resultant melt of the starting material is caused to flow from the upper surface of the susceptor via the susceptor to the lower surface thereof, the melt is crystallized in touch with a seed crystal arranged on the lower surface in advance, and the seed crystal is transferred downwards, whereby a single crystal is grown.

With this method, a large-sized single crystal of an insulator or a semiconductor can be readily produced, and besides a round rod-shaped single crystal, a prism-shaped or pipe-shaped single crystal can be obtained with its sectional dimensions fluctuating little.

16 Claims, 7 Drawing Figures

METHOD FOR GROWING A PIPE-SHAPED SINGLE CRYSTAL

BACKGROUND OF THE INVENTION (i) Field of the Invention:

The present invention relates to a method for growing a single crystal, and more particularly to a method for growing the single crystal of an insulator in a defined shape.

(ii) Brief Description of the Prior Art:

As one method of producing a single crystal, there has heretofore been known the floating zone technique wherein a feed rod is heated into a molten zone by radio frequency heating, laser heating, electron beam heating, arc image heating with an ellipsoidal mirror, or the like, and the molten zone is transferred, thereby turning the feed rod into a single crystal. In addition, as a modification of the floating zone technique, there has also been utilized a method wherein a feed rod which is molten is in contact with one surface of a metal plate heater which is heated by causing current to flow therethrough. The melt is guided to the other surface of the metal plate heater through apertures provided in the metal plate heater and is crystallized when contact is made with a seed crystal located on the other surface. By moving the feed rod so as to supply the raw material, the seed crystal is slowly transferred in the direction opposite to the metal plate heater or downwards, thereby growing the single crystal (hereinafter, this method shall be referred to as "modified floating zone technique"). An example of the metal plate heater for use in the modified floating zone technique is shown in FIG. 1. The details of FIG. 1 will be described later.

Among these floating zone techniques, the method resorting to heating with a laser, an electron beam or an arc image find it difficult to prepare crystals of large diameter because the power of the heat source is low. On the other hand, in the case of employing the radio frequency heating method, it is possible to obtain a sufficiently high power and thus to grow a crystal of large diameter. However, the raw material must be a conductor.

In contrast, due to the use of the resistance-heated metal plate heater, the modified floating zone technique can grow the single crystal even when the raw material is an insulator. In addition, the crystal of large diameter is obtained. With the modified floating zone technique, however, the melt spreads over the entire area of the metal plate and it arrives even to a lead portion for power supply in the worst case, which makes it difficult to stably hold the molten zone. Accordingly, a single-crystal having a uniform diameter cannot be grown by the modified floating zone technique. This has been the serious difficulty of the modified floating zone technique.

SUMMARY OF THE INVENTION

An object of this invention is to eliminate all of the difficulties of the prior art and to provide a method which readily grows a single crystal of an insulator in a defined shape.

In order to accomplish this object, a single crystal growing method according to the present invention is provided which comprises (i) the step of locating a starting material or raw material at one end of a susceptor and locating a seed crystal at the other end thereof, said susceptor being held at a temperature not lower than a melting point of said starting material by radio frequency induction heating, and causing a melt produced by melting of said starting material to flow from said one end of said susceptor via said susceptor to said other end thereof, to bring said melt into touch with said seed crystal, and (ii) the step of transferring said seed crystal at a predetermined rate in a direction opposite to said susceptor and simultaneously feeding said starting material to said one end of said susceptor at a predetermined rate. In this manner, the melt is brought into the seed crystal and the seed crystal is transferred onto the side opposite to the susceptor, whereby the melt in contact with the seed crystal can be crystallized, and further, the melt in touch with the crystallized part is successively crystallized, whereby the single crystal can be grown.

DETAILED DESCRIPTION OF THE INVENTION

A material for making the susceptor must be one which is electrically conductive, which has a melting point higher than that of the starting material and which does not react with the melt. When the single crystal is grown in an oxygen atmosphere or in the air, the susceptor should be made of a material of excellent oxidation resistance. For the growth of, for example, Mn-Zn ferrite, platinum or a platinum-rhodium alloy is employed as the susceptor material. In an inert atmosphere such as nitrogen and argon and in a vacuum, Mo, Ir, Ta, W, Re, Ti, Zr, Nb, graphite etc. can be used as the susceptor materials. Further, some ceramics such as $ZrO_2$ can be used as the susceptor material, but these materials become electrically conductive only at high temperatures. Therefore, the ceramics are heated by any other means at the initiation of use, and they are directly heated by a radio frequency after having become conductive. By way of example, when the ceramics whose outer sides are coated with Ag are employed, the Ag is heated by the radio frequency before the high temperature is reached, and the Ag vanishes and the ceramics themselves are heated by radio frequency after the high temperature has been reached.

Figure 2:
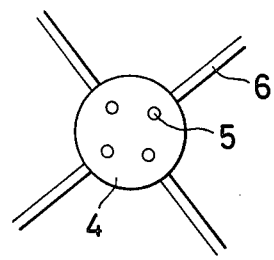
FIG. 2 and FIGS. 3a, 3b and 3c are plane views showing examples of susceptors which are employed in a single crystal growing method according to the present invention.
Figure 3A:
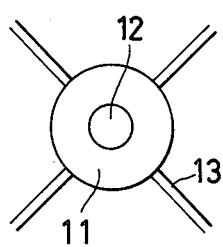
Figure 3B:
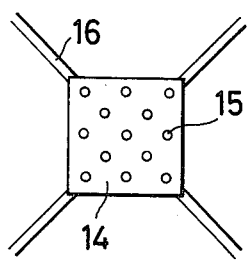
Figure 3C:
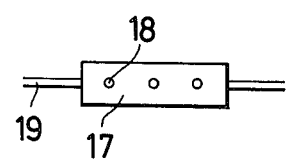

The plane shape of the susceptor is made substantially similar to the sectional shape of the single crystal required, and is made somewhat larger than the latter. The susceptor has one or more apertures through which the melt flows, as may be needed. Usually the susceptor to be employed is flat, but this is not restrictive. FIG. 2 shows a plane view of a susceptor in the case of growing a rod-shaped single crystal, in which numeral 4 designates the susceptor, numeral 5 the aperture through which the melt flows, and numeral 6 an arm for holding the susceptor. FIG. 3a is a plane view of a susceptor in the case of growing a pipe-shaped single crystal, while FIGS. 3b and 3c are plane views of susceptors in the cases of growing single-crystals whose sections are square and rectangular respectively. In FIGS. 3a, 3b and 3c, numerals 11, 14 and 17 designate the susceptors, numeral 12, the aperture corresponding to the central hole of the pipe, numerals 15 and 18, the apertures through which the melt flows, and numerals 13, 16 and 19, arms for holding the susceptors. Usually the apertures indicated at 5, 15 and 18 are provided in the susceptors so that the melt may smoothly flow from one end to the other end of the corresponding susceptor. However, the apertures are not always necessary, and the single crystal can be grown even with a susceptor having no aperture. In this case, the melt flows along the surface of the susceptor. The diameter of the aperture 12 corresponding to the central hole of the pipe is made somewhat smaller than the bore of the single-crystal pipe.

As stated above, the solid single crystal is produced in the case of providing the small apertures in the susceptor, whereas the pipe-shaped single crystal is produced in case of providing the large aperture. The minimum bore of the susceptor required for obtaining the pipe-shaped single crystal varies depending upon the composition of the starting material and the material of the susceptor. By way of example, in the case where ferrite is the starting material and where a Pt-20 wt.% Rh alloy is the susceptor material, an aperture having a diameter of at least 3 mm needs to be provided in the susceptor in order to obtain the pipe-shaped single crystal.

An appropriate thickness of the susceptor is dependent also upon the composition of the starting material and the material of the susceptor. By way of example, in the case where the ferrite is the starting material and where the Pt-20 wt.% Rh alloy is the susceptor material, a thickness of 3-5 mm is appropriate. In general, in the case where the melting point of the starting material is close to that of the material of the susceptor, the single crystal cannot be grown when the thickness of the susceptor is small. The reason is that, even when the peripheral portion of the susceptor has molten, the temperature of the central part thereof does not reach the melting point of the starting material. On the other hand, when the thickness of the susceptor is made larger than is necessary, the radio frequency power must be disadvantageously raised in order to heat the susceptor and the material cost of the susceptor increases. The appropriate thickness of the susceptor can be readily determined by a simple trial-and-error preliminary experiment.

Figure 4:
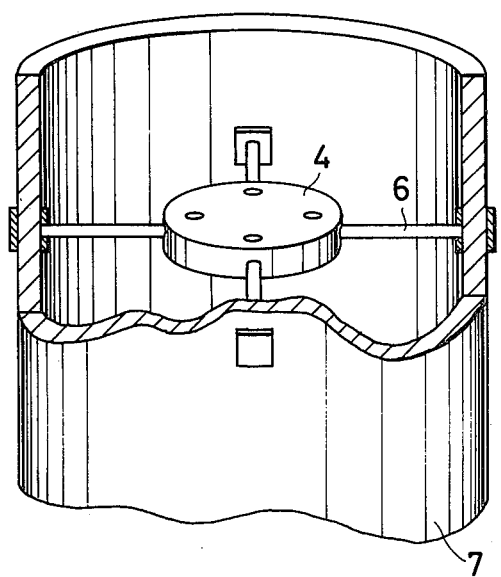
FIG. 4 is a perspective view showing an arrangement for holding the susceptor in an example of the present invention.

The susceptor has the 2-4 arms 6, 13, 16 or 19 as shown in FIGS. 2, 3a, 3b or 3c, but the number of arms may exceed four. As shown in FIG. 4, the susceptor is ordinarily fixed to a surrounding refractory pipe 7 by means of the arms. Preferable the mounting positions of the arms are in the vicinity of the middle portion between one end and the other end of the susceptor on the lateral surface of the susceptor. The arm is made as fine as possible in a range ensuring the fixation, so as to prevent the melt from being conveyed to the arm and to prevent the temperature distribution of the susceptor from becoming non-uniform. The material used to make the arm may be any material which has a melting point higher than of the starting material and that does not react with the starting material or an atmosphere gas under its state of use at a high temperature. The arms and the susceptor are often made of an identical material, which facilitates the welding of the arms to the susceptor.

As described above, the susceptor has only the fixing arms attached thereto and does not include an electrode portion as disposed in the metal plate heater in the prior art. In the single crystal growing method of the present invention, therefore, merely the melt is conveyed to the susceptor and flows and then spreads onto the other end face (in many cases, the lower surface) of the susceptor, so that the molten zone can be stably held. As a result, it has become possible to define the shape of a crystal in conformance with the shape of a susceptor and also to grow a crystal of uniform size (uniform diameter in case of a rod-shaped crystal). By way of example, in case of growing a crystal which has a diameter of 10 mm, a susceptor which has a diameter of 12 mm is suited. In case of using a susceptor whose diameter is too small as compared with the diameter of a crystal, it becomes difficult to obtain a crystal of good quality, and in case where the diameter of a susceptor is much larger than that of a crystal, it is impossible to obtain a crystal which has a uniform diameter and whose shape is uniform.

The diameter of the susceptor is accordingly suitable when it is somewhat larger than that of the crystal to be grown. The size of the susceptor can be readily determined by a simple trial-and-error preliminary experiment.

The starting material may be in any shape if it is continuously supplied to one end of the susceptor at a predetermined rate. Usually favorable results can be easily achieved by making the starting material rod-shaped. The starting material rod can be readily manufactured by the sintering process. However, the invention is not restricted to the sintering process, but any manufacturing method may be utilized.

In case where the starting material is rod-shaped, the outside diameter of the starting material rod must be smaller than that of the susceptor. However, it does not need to be made equal to the outside diameter of the single crystal to be grown, and it can be selected at will in a range in which it is smaller than the outside diameter of the susceptor.

In order to supply the starting material to one end of the susceptor, the starting material rod needs to be transferred at a predetermined rate towards the susceptor. The feed speed of the starting material rod is determined in consideration of the diameter and withdrawal speed of the single crystal to be grown, otherwise the molten zone would vanish during the growth of the crystal. As the growth rate or withdrawal speed of the single crystal, 1-20 mm/hour is appropriate. In case where the withdrawal speed is high, the crystal often becomes a polycrystal, not a single crystal. In general, it is unnecessary to equalize the feed speed of the starting material rod and the withdrawal speed of the seed crystal or single crystal. In actuality, when the feed speed of the feed rod or starting material rod is determined in accordance with the above, ordinarily both of the speeds become different values.

In case where the single crystal to be grown is a round rod, the seed crystal should desirably be rotated in order to attain a uniform temperature distribution of the melt and to keep constant the outside diameter of the crystal to be grown. The rotating speed of the seed crystal in this case may be made 5-100 RPM. In case where the starting material is rod-shaped, the situation of the melt is sometimes stabilized to bring forth favorable results by rotating the feed rod at a rotating speed of 5–100 RPM in the same or opposite rotating direction as that of the seed crystal.

In order to realize a uniform temperature distribution, a heat insulator or refractory material is often inserted between a radio frequency coil and the susceptor. Although the use of the refractory material is desirable, it is not indispensable.

The atmosphere for the growth of the single crystal varies depending upon substances constituting the single crystal. By way of example, oxygen or air is used as the atmosphere in case of ferrites such as Mn-Zn ferrite. In general, the atmospheres may be identical to those employed in other prior-art methods of growing single crystals, such as Czochralski method.

With the single crystal growing method according to the present invention described above, not only single crystals of a conductor and a semiconductor but also a single crystal of an insulator can be readily grown, and a single crystal of large diameter can be produced. The control of the diameter of a crystal, which has been difficult with the prior-art modified floating zone technique has become possible, and it has been possible to prepare a crystal having a substantially uniform diameter. Further, it has become possible to grow a single crystal having a section of predetermined shape by selecting the shape of the susceptor. By way of example, the diameter of a single crystal grown by the prior-art modified floating zone technique has fluctuations of 20–50% in dependence on places, whereas fluctuations in the diameter of a round rod-shaped single crystal produced by the single crystal growing method of the present invention are reduced to 10% or less. With the single crystal growing method of the present invention, it has become possible to prepare single crystals having sectional shapes such as for example, square and rectangular shapes. Such a preparation is impossible with the prior-art methods of manufacture. Due to the present invention, the utilization factor of a crystal in the case of cutting the grown single crystal and preparing material pieces for elements has been sharply enhanced, and the number of the elements which can be prepared from one crystal has been increased.

DESCRIPTION OF THE PRESENTLY PREFERRED EMBODIMENTS

Hereunder, the present invention will be described more in detail in connection with embodiments and a reference example.

EXAMPLE 1

Figure 5:
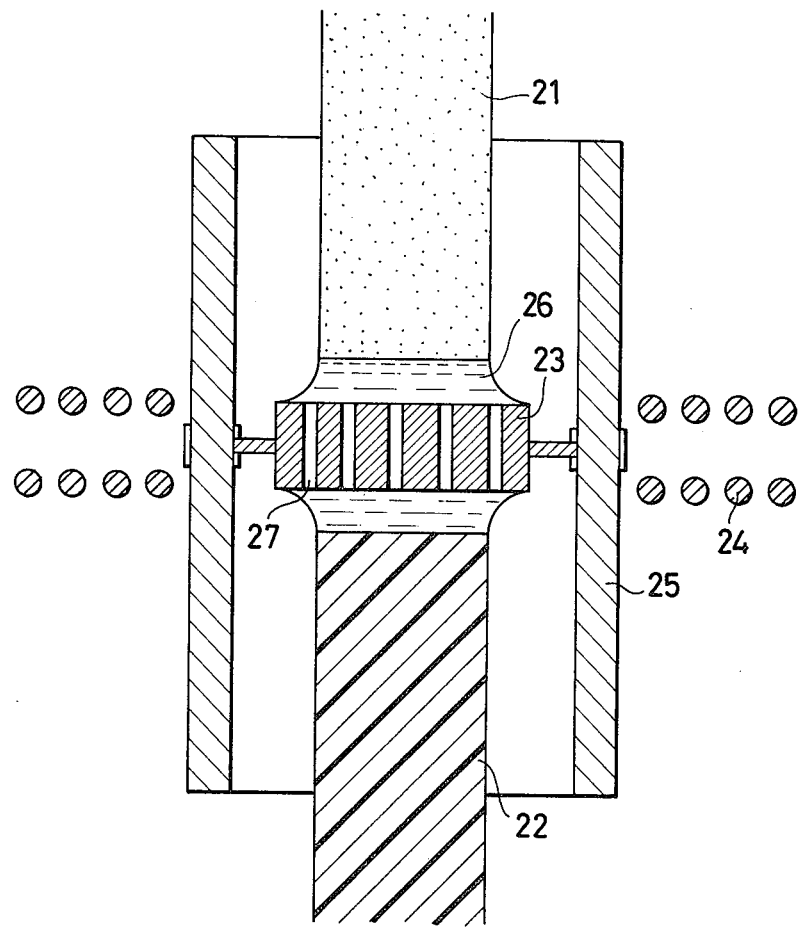
FIGS. 5, 6 and 7 are sectional views showing single crystal growth apparatuses employed in examples of the present invention.

FIG. 5 shows a sectional view of a single crystal growing apparatus. As a feed rod or starting material rod 21, a sintered Mn-Zn ferrite ($Mn_3Zn_2Fe_{10}O_{20}$) was used. As a seed crystal 22, a single crystal of Mn-Zn ferrite was employed. A susceptor 23 was made of a platinum-20 wt. % rhodium alloy, and had a large number of small holes 27 in a disc. The susceptor 23, a radio frequency coil 24 and a refractory material 25 were fixed. The feed rod 21 and the seed crystal 22 were respectively connected to a driving mechanism so as to be movable upwards or downwards relatively to the susceptor.

The Mn-Zn ferrite feed rod 21 was caused to descend in touch with the susceptor 23 which was subjected to a radio frequency electric field of 100 KHz and heated to 1,600° C. by means of the radio frequency coil 24. As a result, the feed rod melted at the upper part of the susceptor, and its melt 26 reached the lower part of the susceptor through the holes 27 provided in the susceptor and crystallized on the seed crystal 22 placed under the susceptor.

When the seed crystal was smaller in the sectional shape than the susceptor, favorable results were obtained. The thickness of the susceptor was made 3–5 mm. The radio frequency power was made, for example, 4 KW in the case where the diameter of the single crystal to be grown was 10 mm. The atmosphere of the crystal growth was made oxygen or air. The susceptor was fixed as illustrated in FIG. 4. Regarding the size of the feed rod, there was no problem when the diameter of the feed rod was smaller than that of the susceptor. Regarding the density of the feed rod, there was no special problem even when it was as low as about 70%.

The temperature distribution of the melt was improved by rotating the seed crystal, and a single crystal which was substantially in the shape of a circular cylinder was produced on the seed crystal at a rotational frequency of 5–40 RPM. Further, experiments of growing the Mn-Zn ferrite were conducted by varying the outside diameter of the starting material, the outside diameter of the susceptor, the descending speed of the feed rod and the descending speed of the seed crystal. The results are summed up in Table 1. In this manner, the descending speeds of the starting material and the seed crystal can be readily decided by simple experiments.

Owing to the above experiments, it has been revealed that even a substance of high resistivity can be molten easily and subjected to the zone melting crystal growth by applying the susceptor to the radio frequency induction heating method. With this method, a circular cylinder-shaped crystal which has a substantially constant outside diameter dependent upon the outside diameter of the susceptor can be grown. Further, the zone melting crystal growth of a large-sized crystal hitherto deemed difficult has become possible. This is considered to indicate that since the melt is in touch with the susceptor, the tension between both will prevent the melt from dropping. On the other hand, it has been revealed that the temperature distribution in the radial direction as becomes a problem in case of growing a large-sized crystal is made very uniform by the effect of the susceptor. Due to this effect, large-sized single crystals of good quality could be grown.

TABLE 1

| Experimental No. | Outside Diameter of Starting Material | Outside Diameter of Susceptor | Descending Speed of Starting Material | Descending Speed of Seed Crystal | Outside Diameter of Grown Crystal | Outside Diameter Fluctuations of Grown Crystal (mm) |
|---|---|---|---|---|---|---|
| 1 | 10 mm | 15 mm | 10 mm/hour | 8 mm/hour | 10 mm | ± 0.8 |
| 2 | 10 | 15 | 10 | 5 | 13 | ± 0.6 |
| 3 | 20 | 25 | 7 | 5 | 22 | ± 1.3 |
| 4 | 30 | 40 | 8 | 5 | 35 | ± 1.5 |
| 5 | 40 | 50 | 5 | 3 | 46 | ± 1.7 |

TABLE 1-continued

| Experimental No. | Outside Diameter of Starting Material | Outside Diameter of Susceptor | Descending Speed of Starting Material | Descending Speed of Seed Crystal | Outside Diameter of Grown Crystal | Outside Diameter Fluctuations of Grown Crystal (mm) |
|---|---|---|---|---|---|---|
| 6 | 50 | 60 | 5 | 3 | 57 | ± 1.6 |

EXAMPLE 2

Figure 6:
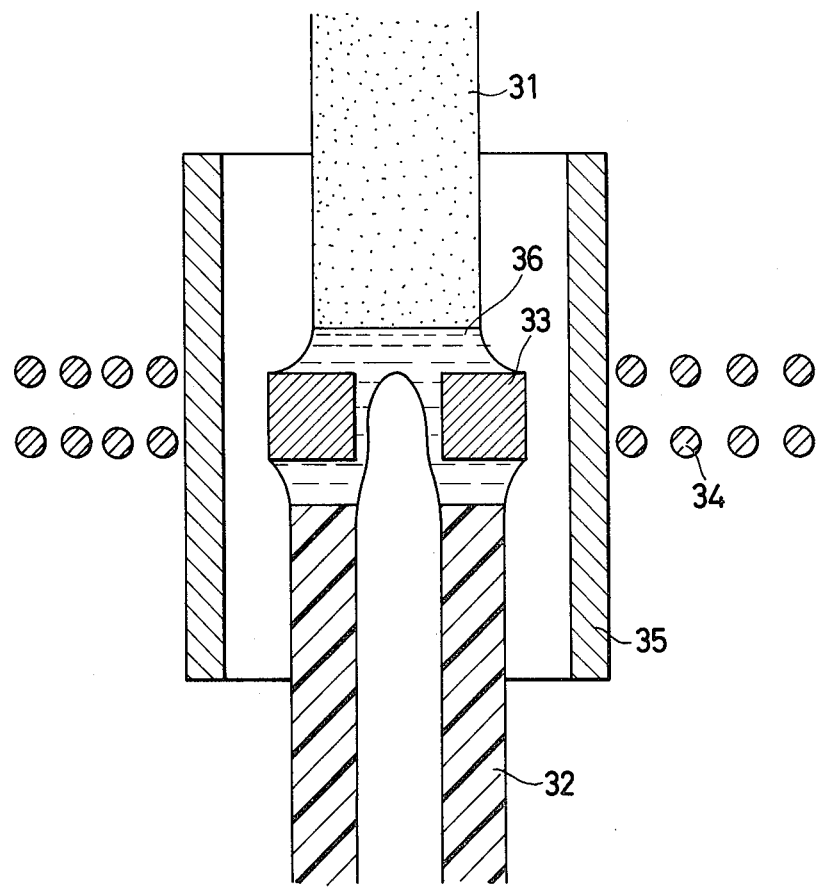

The shape of the susceptor was changed into a ring form as shown in FIG. 6 in Example 1, and the same experiments as in Example 1 were conducted. The thickness of the susceptor was made 3–5 mm.

An Mn-Zn ferrite single crystal consequently obtained was a pipe-shaped single crystal. The inside diameter and outside diameter of the grown single crystal related with the outside diameter and descending speed of the feed rod, the descending speed of the seed crystal and the inside diameter and outside diameter of the susceptor. The seed crystal did not need to be pipe-shaped, and the outside diameter of the seed crystal was allowed to be any value within the range between the inside diameter and outside diameter of the susceptor. Experimental results are listed in Table 2.

Due to the above experiments, it has been revealed that a pipe-shaped single crystal which hitherto could be prepared only by th EFG (Edge-defined Film-fed Growth) technique of the Czochralski method can be prepared by the zone melting crystal growth by applying the ring-shaped susceptor.

The pipe-shaped single crystals of the Mn-Zn ferrite thus produced could be used as the ferrite cores of an antenna, a transformer, a tuner etc. In FIG. 6, numeral 31 designates a feed rod, numeral 32 a grown single crystal, numeral 33 a susceptor, numeral 34 a radio frequency coil, numeral 35 a refractory material, and numeral 36 a melt.

meral 44 a radio frequency coil, numeral 45 a refractory material and numeral 46 a melt.

EXAMPLE 4

In Example 1 the feed rod was changed into sintered compacts of Si, Ge, Insb, $Bi_4Ge_3O_{12}$, SBN ($Sr_xBa_{1-x}Nb_2O_6$), $Gd_2(MoO_4)_3$, $LiTaO_3$, $Gd_3Ga_5O_{12}$ and $Al_2O_3$, and the experiments of growing the single crystals of these substances were conducted. As the susceptors, graphite, platinum and iridium were properly used in dependence on the melting points of the starting materials. The seed crystal was rotated at 20 RPM. The atmosphere of the crystal growth was oxygen or air for $Bi_4Ge_3O_{12}$, SBN and $Gd_2(MoO_4)_3$; argon for Si, Ge and InSb; and nitrogen gas for $LiTaO_3$, $Gd_3Ga_5O_{12}$ and $Al_2O_3$.

The experimental results are collectively indicated in Table 3. In consequence, single crystals having outside diameters of 10 mm to 50 mm and lengths of 100 mm could be readily grown. The method of this invention has the advantage that a crucible employed in the Czochralski method is not required and that the manufacture is possible with the very simple apparatus. Since the method of this invention is the zone melting process, it is a matter of course that the segregation of a composition does not occur in the direction of growth. Since the quantity of the melt is small and the melting time is short, the method of this invention is also applicable to materials prone to vaporize.

TABLE 2

| Experimental No. | Outside Diameter of Starting Material | Inside Diameter Outside Diameter of Susceptor | Descending Speed of Starting Material | Descending Speed of Seed Crystal | Inside Diameter of Grown Crystal | Outside Diameter of Grown Crystal | Outside Diameter Fluctuations of Grown Crystal (mm) |
|---|---|---|---|---|---|---|---|
| 11 | 10 mm | 5/15 mm | 10 | 6 | 5 mm | 14 mm | ± 0.8 |
| 12 | 20 | 8/25 | 8 | 5 | 9 | 24 | ± 1.4 |
| 13 | 30 | 10/40 | 5 | 3 | 12 | 39 | ± 1.6 |
| 14 | 40 | 15/50 | 5 | 3 | 17 | 48 | ± 1.6 |

EXAMPLE 3

Figure 7:
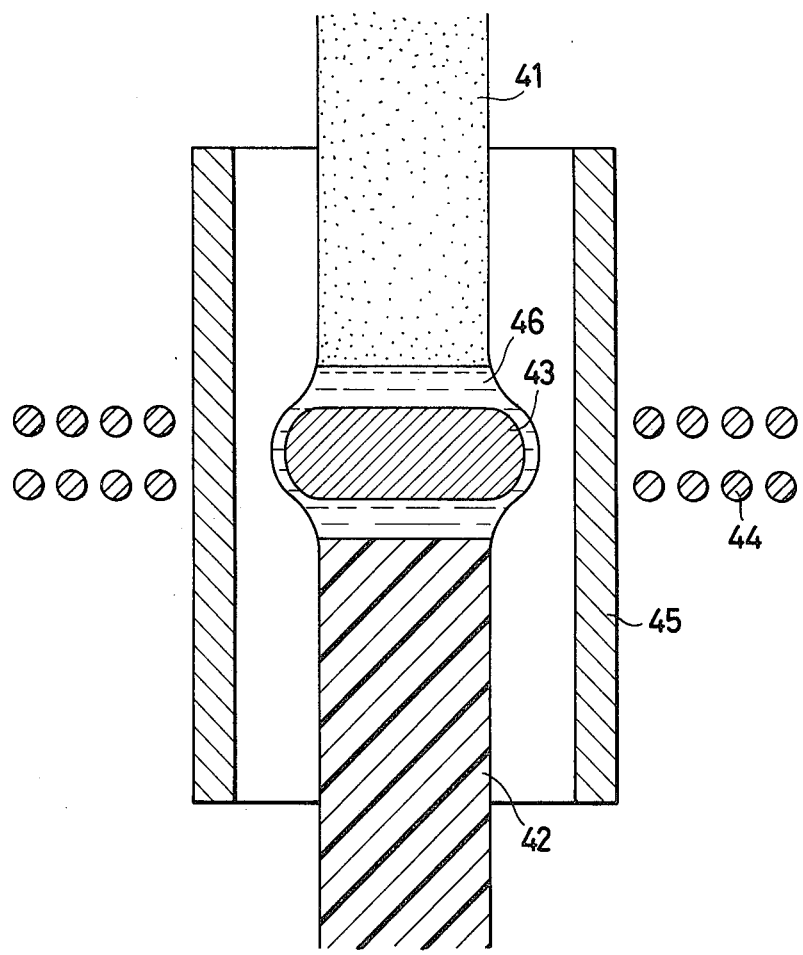

The shape of the susceptor was changed into the form of a disc with no aperture as shown in FIG. 7 in Example 1, and the same experiments as in Example 1 were conducted.

As a result, the melt of the Mn-Zn ferrite molten upon contacting with the susceptor flowed along the surface of the susceptor and crystallized as a single crystal on the seed crystal underlying the susceptor.

Regarding this result, since the wettability between the melt of the Mn-Zn ferrite and the platinum-rhodium susceptor is excellent, the melt flowed smoothly and the single crystal growth was possible. With this method, circular cylinder-shaped single crystals having outside diameters of 10 mm to 40 mm could be grown. Fluctuations in the outside diameters of the grown single crystals were ±0.6 to ±1.6 mm.

In FIG. 7, numeral 41 indicates a feed rod, numeral 42 a grown single crystal, numeral 43 a susceptor, nu-

TABLE 3

| Experimental No. | Starting Material | Material of Susceptor | Growth Rate | Outside Diameter of Grown Crystal | Outside Diameter Fluctuations of Grown Crystal (mm) |
|---|---|---|---|---|---|
| 1 | $Bi_4Ge_3O_{12}$ | platinum | 6 mm/hour | 30 mm | ± 1.3 |
| 2 | $Bi_4Ge_3O_{12}$ | platinum | 6 | 45 | ± 1.6 |
| 3 | SBN | platinum | 10 | 30 | ± 1.3 |
| 4 | $Gd_2(MoO_4)_3$ | platinum | 7 | 30 | ± 0.8 |
| 5 | Si | graphite | 8 | 30 | ± 1.4 |
| 6 | Si | graphite | 8 | 50 | ± 1.5 |
| 7 | Ge | graphite | 6 | 30 | ± 1.3 |
| 8 | InSb | graphite | 7 | 30 | ± 1.4 |
| 9 | $LiTaO_3$ | iridium | 5 | 30 | ± 1.4 |
| 10 | $Gd_3Ga_5O_{12}$ | iridium | 10 | 30 | ± 1.4 |
| 11 | $Al_2O_3$ | iridium | 16 | 30 | ± 1.3 |
| 12 | $Al_2O_3$ | iridium | 16 | 45 | ± 1.5 |

REFERENCE EXAMPLE 1

Figure 1:
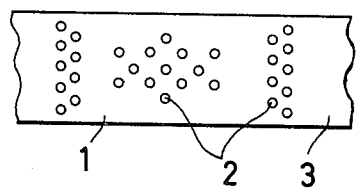
FIG. 1 is a plane view showing a metal plate heater which is employed in a prior-art modified floating zone technique.

A platinum-20 wt.% rhodium alloy plate 1 in a shape shown in FIG. 1 in which a longer side was 80 mm, a shorter side was 15 mm and a thickness was 1.5 mm was heated to 1,650° C. by resistance heating, and a sintered Mn-Zn ferrite which had an outside diameter of 10 mm and a length of 150 mm was fed from above the platinum-rhodium alloy plate at a rate of 5 mm/hour. A seed crystal having a diameter of 8 mm was placed under the alloy plate, and while rotating the former at a speed of 10 RPM, it was moved downwards at a withdrawal speed of 5 mm/hour. Thus, an Mn-Zn ferrite single crystal was produced.

The crystal obtained was a single crystal of a size having an outside diameter of about 9 mm and a length of about 80 mm, but the outside diameter fluctuated violently and varied between 6 and 13 mm. The crystal did not become circular but became elliptic in section, and it twisted. In FIG. 1, numeral 2 indicates apertures through which the melt flows, and numeral 3 a lead portion.

EXAMPLE 5

The platinum-20 wt.% rhodium alloy susceptor in the shape shown in FIG. 2 in which the diameter was 12 mm and the thickness was 4 mm was heated to 1,650° C. by the radio frequency heating at 100 KHz, and a sintered Mn-Zn ferrite having an outside diameter of 10 mm and a length of 150 mm was fed from above the susceptor at a rate of 6 mm/hour. A seed crystal having a diameter of 8 mm was placed under the susceptor, and while rotating the former at a speed of 10 RPM, it was transferred downwards at a speed of 4 mm/hour. Thus, an Mn-Zn ferrite single crystal was produced.

As a result, the crystal obtained was a circular cylinder-shaped single crystal of a size having a diameter of 11 mm and a length of 100 mm, and the diameter scarcely fluctuated and was uniform to be 10.5–11.5 mm. In addition, the section of the crystal became substantially circular.

EXAMPLE 6

In Example 5 the sintered feed rod and the seed crystal were changed from the Mn-Zn ferrite into $Bi_4Ge_3O_{12}$, and the platinum-rhodium alloy susceptor was changed into a platinum susceptor, whereupon the same growth experiment as in Example 5 was conducted.

As a result, a single crystal having a diameter of 11 mm and a length 90 mm could be obtained. The diameter of the crystal was so uniform as to be 10.5–11.5 mm, and the section thereof was substantially circular.

EXAMPLE 7

In Example 1 the shape of the susceptor was made square and flat as shown in FIG. 3b, whereupon the same experiment as in Example 1 was conducted. The susceptor was a platinum-20 wt.% rhodium alloy plate which was a square with one side being 15 mm and which was 4 mm thick, the starting material was a sintered rod which had an outside diameter of 12 mm, the descending speed of the starting material was 5 mm/hour, and the descending speed of the seed crystal was 4 mm/hour. The seed crystal was not rotated.

As a result, the Mn-Zn ferrite single crystal obtained was in a prism shape whose section was a square with one side being about 10 mm, and the fluctuations of the length of each side were within ±0.8 mm. The angles of the square of the section were somewhat round. In this manner, the rod-shaped ferrite single crystal having the substantially square sectional shape could be produced by the method of this invention.

As set forth above, according to this invention, high-resistivity materials such as insulators and semiconductors can be subjected to the zone melting crystal growth by the radio frequency induction heating method. Also in case of growing a large-sized single crystal, unlike the floating zone process, a melt is supported by a susceptor and is therefore free from the fear of dropping. Another advantage is that single crystals in a pipe shape etc. can be readily grown by varying the shape of the susceptor. Further, unlike the prior-art method of zone melting crystal growth, a single crystal of good quality can be grown even when uniformities in the straightness and density of a feed rod are inferior. As compared with the prior-art modified floating zone technique, the method of this invention is much more excellent in defining the diameter of a single crystal to be grown.

Obviously many modifications and variations of the present invention are possible in the light of the above teachings. It is therefore to be understood that within the scope of the appended claims the invention may be practiced otherwise than as specifically described.

What is claimed is:

1. A method for growing a pipe-shaped single crystal which comprises providing a starting material at one side of a susceptor and locating a seed crystal on the other side thereof, said susceptor being provided with a hole in its central portion so as to grow said pipe-shaped crystal, maintaining the susceptor at a temperature not lower than the melting point of said starting material by radio frequency induction heating, and causing a melt produced by the melting of said starting material to flow from said one side of said susceptor via said susceptor to said other side thereof, whereby said melt is made to contact said seed crystal, and moving said seed crystal at a predetermined rate in a direction away from said susceptor and simultaneously feeding said starting material to said one side of said susceptor at a predetermined rate.

2. The method for growing a single crystal as defined in claim 1, wherein said starting material has a rod shape.

3. The method for growing a single crystal as defined in claim 2, wherein said starting material is a sintered element.

4. The method for growing a single crystal as defined in claim 1, wherein said susceptor is provided with a hole in its central portion so as to grow a pipe-shaped single crystal.

5. The method for growing a single crystal as defined in claim 1, wherein the starting material is made of a ferrite material.

6. The method for growing a single crystal as defined in claim 5, wherein the susceptor is made of a platinum or a platinum-rhodium alloy.

7. The method of claim 5 wherein the ferrite material is Mn-Zn ferrite.

8. The method of claim 1 wherein the susceptor is made of an electrically conductive material which does not react with the melt and which has a melting point higher than that of the starting material.

9. The method of claim 1 wherein when said single crystal is grown in an oxygen atmosphere or in the air, and the susceptor is made of platinum or a platinum-rhodium alloy.

10. The method of claim 1 wherein when said single crystal is grown in an inert atmosphere, the susceptor is made of a material selected from the group consisting of Ta, W, Re, Mo, Ti, Zr, Nb, Ir and graphite.

11. The method of claim 1 wherein the susceptor is made of a ceramic material.

12. The method of claim 1 wherein the seed crystal is rotated in order to attain a uniform temperature distribution of the melt and to keep constant the outside diameter of the crystal to be grown.

13. The method of claim 1 wherein a refractory material is inserted between the radio frequency induction heating and the susceptor.

14. The method for growing a pipe-shaped single crystal as defined in claim 1, wherein said starting material is selected from at least one member of the group consisting of Si, Ge, InSb, $Bi_4Ge_3O_{12}$, SBN, $Gd_2(MoO_4)_3$, $LiTaO_3$, $Gd_3Ga_5O_{12}$, and $Al_2O_3$.

15. A device for growing a pipe-shaped single crystal which comprises a susceptor having a hole in its central portion, a seed crystal disposed on one side of the susceptor, a starting material disposed on the other side of the susceptor, radio frequency induction heating means operatively associated with said susceptor for maintaining the susceptor at a temperature not lower than the melting point of the starting material whereby the starting material is caused to melt and flow from one side to the other side of said susceptor where said melt is made to contact said seed crystal, means for feeding said starting material toward said susceptor at a predetermined rate and means for withdrawing said seed crystal away from said susceptor at said predetermined rate.

16. The device of claim 15 wherein a refractory material is inserted between the radio frequency induction heating and the susceptor.

* * * * *